(12) United States Patent
Rabner et al.

(10) Patent No.: US 8,110,788 B2
(45) Date of Patent: Feb. 7, 2012

(54) METHOD AND DEVICE FOR DETECTING WEAK OPTICAL SIGNALS

(75) Inventors: Arthur Rabner, Natania (IL); Yosi Shacham-Diamand, Zikhron-Yaakov (IL); Mark Oksman, Bat-Yam (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 271 days.

(21) Appl. No.: 12/309,046

(22) PCT Filed: Jul. 4, 2007

(86) PCT No.: PCT/IL2007/000834
§ 371 (c)(1),
(2), (4) Date: Jan. 5, 2009

(87) PCT Pub. No.: WO2008/004230
PCT Pub. Date: Jan. 10, 2008

(65) Prior Publication Data
US 2009/0272882 A1 Nov. 5, 2009

(30) Foreign Application Priority Data
Jul. 4, 2006 (IL) .......................................... 176694

(51) Int. Cl.
*H04N 17/00* (2006.01)
(52) U.S. Cl. ............. 250/208.1; 250/214 A; 250/214 VT
(58) Field of Classification Search ................ 250/208.1, 250/207, 214 VT, 370.09, 370.11, 372; 313/103 CM, 105 CM, 105 R; 348/216.1, 217.1
See application file for complete search history.

(56) References Cited

U.S. PATENT DOCUMENTS

| 6,596,980 B2 | 7/2003 | Rusu et al. |
| 6,747,258 B2 | 6/2004 | Benz et al. |
| 6,919,919 B2 * | 7/2005 | Nelson et al. ................. 348/187 |
| 7,015,452 B2 * | 3/2006 | Benz et al. ............. 250/214 VT |

FOREIGN PATENT DOCUMENTS
WO  WO 2008/004230  1/2008

OTHER PUBLICATIONS

International Preliminary Report on Patentability Dated Jan. 22, 2009 From the International Bureau of WIPO Re.: Application No. PCT/IL2007/000834.
Office Action Dated Jan. 13, 2009 From the Israeli Patent Office Re.: Application No. 176694.
Verle et al. "EBAPS: Next Generation Low Power, Digital Night Vison", OPTRO International Symposium, 2005.

* cited by examiner

*Primary Examiner* — Tony Ko

(57) ABSTRACT

An optical detection device is disclosed. The device comprises a photoelectric unit, configured to sense incoming photons and to produce electrical signals pertaining to at least a few of the photons within a plurality of temporally resolved time-windows; an analog-to-digital unit, configured to generate digital representation of the electrical signals; and a digital integrating unit, configured to integrate the digital representation over at least part of the temporally resolved time-windows to provide integrated data corresponding to the photons.

35 Claims, 15 Drawing Sheets
(2 of 15 Drawing Sheet(s) Filed in Color)

METHOD AND DEVICE FOR DETECTING WEAK OPTICAL SIGNALS

RELATED APPLICATIONS

This Application is a National Phase of PCT Patent Application No. PCT/IL2007/000834 having International filing date of Jul. 4, 2007, which claims the benefit of Israel Provisional Patent Application No. 176694 filed on Jul. 4, 2006. The contents of the above Applications are all incorporated herein by reference.

FIELD AND BACKGROUND OF THE INVENTION

The present invention relates to optical detection and, more particularly, but not exclusively, to method and device for detecting weak optical signals, e.g., for the purpose of imaging.

Recording and measuring a weak signal presents challenging and acute problems for the designers of modern sensors for myriad applications in diverse fields of science and technology. In these sensors, various primary signals (optical, ultrasonic, mechanical, chemical, radiation, etc.) are transformed into elementary charge carriers, such as electrons, holes or ions. Signal charge packets of such elementary charge carriers are amplified and converted to an electrical signal which is fed into a recording or analyzing device and/or used as a feedback signal for monitoring.

In many applications, such as those relating to imaging systems, sensor devices with critical threshold parameters are in an acute demand. Such applications demand sensors capable of detecting and recording of optical signals that are not only weak, but also short in duration and/or rapidly varying. Accordingly, these applications require a sensor capable of amplifying such electrical signals over a wide bandwidth and with a low noise level. Optical signal amplification are evaluated according to variety of parameters, such as, signal resolution, threshold sensitivity, response speed, complexity, physical size, physics principle, power consumption, manufacturing technology, reliability, cost and the like. Many of these parameters are not independent and high-performance systems are usually more complex and expensive.

One approach to the detection of weak optical signals is the use of photodetectors in which the exposure times are long. These photodetectors typically employ semiconductor technology. Long exposure time photodetectors are suitable for static light source having constant intensity over time (e.g., stars), but are not suitable for rapid imaging applications in which the light has non constant emission intensity and/or originate from moving objects.

A known problem with long exposure time photodetectors is that thermally induced currents exist in the semiconductor even in the absence of incident optical signal. Such current is referred to in the literature as "dark current." Attempts have been made to devise low dark current detectors, which are typically cauterized by high QE and high Fill Factor (FF) so as to minimize the signal loss. Exposure periods up to approximately one hour are achievable by cooling the detector typically by means of thermoelectric coolers. Such detectors, however, are very expensive and usually used in the area of astronomy research.

Another approach employs avalanche amplification (multiplication) of charge carriers. To date, avalanche amplification is recognized as a highly sensitive and high-speed method of amplification. Avalanche amplification is based on impact ionization arising in a strong electric field. The charge carriers accelerate in the electric field and ionize the atoms of the working medium of the amplifier, resulting in multiplication of the charge carriers. At a high multiplication factor, however, it is difficult to stabilize the avalanche amplification operating point. Additionally, the internal noise level and the response time grow rapidly with the multiplication factor.

Avalanche amplification based photodetectors are capable of converting a single photon to charge carriers and multiplying the charge. The number of photonic events is statistically estimated using the known QE of the device. These photodetectors are suitable for static and well as dynamic light sources. Representative examples of such photodetectors include, high resolution arrays of photomultiplier tubes, avalanche photodiode array activated in the Geiger mode, electron multiplied CCDs, and intensified image sensors.

Photomultiplier tubes are bulky devices constructed from a vacuum tube which houses a photocathode, an electron multiplier and an anode. Incident photons strike the photocathode material thereby producing electrons under the photoelectric effect. These electrons are directed towards the electron multiplier, where electrons are multiplied by the process of secondary emission. The electrons are accumulated at the anode resulting in a sharp current pulse indicating the arrival of a photon. For the very low resolution imaging, multi-anode photomultiplier tubes are available; however, they are extremely costly and their resolution is far from imaging demands.

Avalanche photodiodes are the semiconductor analog to the photomultiplier tubes. By applying a high reverse bias voltage, an avalanche photodiode presents an internal current gain effect due to impact ionization. Unlike the photomultiplier tube, an array of the avalanche photodiode provides high resolution imaging with medium cost effectiveness. However, these devices suffer from high dark current and therefore require cooling to cryogenic temperatures for single photon imaging. The cooling requirement presents a major drawback to the technology because the cooling system significantly increases the power consumption, dimensions and cost of the device.

Electron multiplying CCDs combine high photon conversion efficiency (up to 90%) with reduction of the readout noise. The technology is used in high-end applications such as low-light dynamic cellular microscopy and single molecule detection. The electron multiplying CCD does not require high voltage supply; however, similarly to the avalanche photodiodes, the single photon detection can only be achieved if the device is cooled to cryogenic temperature.

Image intensified sensors are based on more promising technology. Most sensors employ a CCD and an image intensifier that is fiber optically coupled to the CCD to increase the sensitivity down to single photon level. Other sensors employ a CMOS image sensor instead of a CCD. Unlike the CCD, the CMOS image sensor already includes circuitry therein. The image intensified sensors are expensive, relatively bulky and power consuming. Moreover, multiple optical interfaces in the coupling between the image intensifier and the CCD or CMOS results in image degradation.

Another type of image intensified sensors addresses the problem of image degradation by employing a process known as electron-bombarded semiconductor gain. One such image intensified sensor is the Electron Bombarded CCD (EBCCD) which consists of a back illuminated CCD used as an anode in proximity focus with the photocathode. The term "proximity focus" is known in the art and referrers to a configuration in which the photocathode and the anode are spaced closely together. Photoelectrons from the photocathode are accelerated to and directly imaged in the back illuminated CCD which is enclosed into vacuum enclosure. The gain is achieved by the electron-bombarded impact ionization inducing signal related charge multiplication (low noise semiconductor gain process). The EBCCD eliminates the necessity in micro channel plate phosphor screen, and fiber optics tapers of the image intensifiers. An EBCCD is disclosed in U.S. Pat. No. 4,687,922.

Conventional EBCCD suffer from several limitations. When the CCD is of frame-transfer type, the vacuum enclosure volume is relatively large. On the other hand, when the CCD is of interline-transfer, the vacuum enclosure volume is smaller but a mechanical shutter is required.

An additional limitation is the complicated manufacturing process which requires specialized processing to provide thin semiconductor and to passivate the back surface. A further limitation is the relatively large dimension of the device.

There is thus a widely recognized need for, and it would be highly advantageous to have, a method and device for detecting weak optical signals devoid of the above limitations.

SUMMARY OF THE INVENTION

According to one aspect of the present invention there is provided an optical detection device. The optical device comprises a photoelectric unit configured to sense incoming photons and to produce electrical signals pertaining to at least a few of the photons within a plurality of temporally resolved time-windows. The device further comprises an analog-to-digital unit configured to generate digital representation of the electrical signals, and a digital integrating unit configured to integrate the digital representation over at least part of the temporally resolved time-windows to provide integrated data corresponding to the photons.

According to another aspect of the present invention there is provided an optical detection. The method comprises using a photoelectric unit for sensing incoming photons and providing electrical signals pertaining to at least a few of the photons, within a plurality of temporally resolved time-windows. The method further comprises generating digital representation of the electrical signals and integrating the digital representation over at least part of the temporally resolved time-windows to provide integrated data corresponding to the photons.

According to yet another aspect of the present invention there is provided a method of calibrating the optical detection device. The method comprises configuring the photoelectric unit, the analog-to-digital unit and the digital integrating unit such that the photoelectric unit senses incoming photons and produces electrical signals pertaining to at least a few of the photons within a plurality of temporally resolved time-windows, the analog-to-digital unit generates digital representation of the electrical signals, and the digital integrating unit integrates the digital representation over at least part of the temporally resolved time-windows.

According to still another aspect of the present invention there is provided a method of manufacturing an optical detection device. The method comprises: assembling a photoelectric unit, an analog-to-digital unit and a digital integrating unit; and configuring the photoelectric unit, the analog-to-digital unit and the digital integrating unit as described herein.

According to further features in preferred embodiments of the invention described below, the electric signals comprise secondary electrons component and dark current component, and the temporally resolved time-windows are selected sufficiently narrow such that the secondary electrons component is higher than the dark current component.

According to still further features in the described preferred embodiments the photoelectric unit comprises a collection area dividable into a plurality of spatially resolved locations, and wherein the digital representation is generated separately for each spatially resolved location of the plurality of spatially resolved locations.

According to still further features in the described preferred embodiments digital representation corresponding to at least two spatially resolved locations is generated sequentially.

According to still further features in the described preferred embodiments digital representation corresponding to at least two spatially resolved locations is generated concurrently.

According to still further features in the described preferred embodiments the area of each spatially resolved location of the plurality of spatially resolved locations is selected sufficiently small such that the secondary electrons component is higher than the dark current component.

According to still further features in the described preferred embodiments an exposure time of the photoelectric unit is selected such that the secondary electrons component is higher than the dark current component.

According to still further features in the described preferred embodiments at least one of the area and the exposure time is selected such that the ratio between the secondary electrons component and the dark current component is at least two.

According to still further features in the described preferred embodiments the analog-to-digital unit is calibrated to exclude contribution of the dark current component from the digital representation.

According to still further features in the described preferred embodiments the electric signals comprise a readout noise component and the analog-to-digital unit is calibrated to exclude contribution of the readout noise component from the digital representation.

According to still further features in the described preferred embodiments the analog-to-digital unit is calibrated to exclude contribution of the combination of the readout noise component and the dark current component from the digital representation.

According to still further features in the described preferred embodiments an integration time characterizing the digital integration is selected so as to reduce or eliminate the dark current component.

According to still further features in the described preferred embodiments the analog-to-digital unit comprises a pre analog-to-digital amplifier characterized by a gain and an offset, and an analog-to-digital converter characterized by a quantization resolution, wherein at least one of the quantization resolution. According to still further features in the described preferred embodiments the gain and/or offset is selected such that the secondary electrons contribution is amplified to the least significant bit level of the analog-to-digital converter.

According to still further features in the described preferred embodiments the photoelectric unit comprises an intensifier for multiplying photoelectrons produced by the photoelectric unit, thereby increasing the secondary electrons component.

According to still further features in the described preferred embodiments gain characterizing the intensifier is selected such that the secondary electrons component is higher than the readout noise component.

According to still further features in the described preferred embodiments the sensing unit comprises electron bombarded CCD.

According to still further features in the described preferred embodiments the sensing unit comprises electron bombardment CMOS image sensor.

According to a further aspect of the present invention there is provided an imaging device, e.g., a camera, comprising the detection device. According to further features in the described preferred embodiments the device is configured for capturing images of moving objects. According to still further features in the described preferred embodiments the device is configured for providing video images. According to still further features in the described preferred embodiments the device is configured for capturing images of static objects.

According to a further aspect of the present invention there is provided a night vision apparatus, comprising the detection device.

Other aspects of the present invention include an imaging device comprising the detection device, an optical sensor which comprising the detection device, an object detection system comprising the optical sensor, a motion detection system comprising the optical sensor, a proximity detection system comprising the optical sensor, a temperature measuring system comprising the optical sensor, and a parallel light counting system comprising the optical sensor.

The present invention successfully addresses the shortcomings of the presently known configurations by providing a method and device for detecting weak optical signals.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

Implementation of the method and system of the present invention involves performing or completing selected tasks or steps manually, automatically, or a combination thereof. Moreover, according to actual instrumentation and equipment of preferred embodiments of the method and system of the present invention, several selected steps could be implemented by hardware or by software on any operating system of any firmware or a combination thereof. For example, as hardware, selected steps of the invention could be implemented as a chip or a circuit. As software, selected steps of the invention could be implemented as a plurality of software instructions being executed by a computer using any suitable operating system. In any case, selected steps of the method and system of the invention could be described as being performed by a data processor, such as a computing platform for executing a plurality of instructions.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 1 is a schematic illustration of an optical detection device, according to various exemplary embodiments of the present invention;

FIG. 2 is a schematic illustration of photonic and electronic events within a plurality of temporally resolved time-windows, according to various exemplary embodiments of the present invention;

FIG. 3 is a schematic illustration of a digital representation of the electronic events of FIG. 2, according to various exemplary embodiments of the present invention;

FIG. 4 is a schematic illustration of an anode device in a preferred embodiment in which the collection area of the anode device is dividable into a plurality of spatially resolved locations, according to various exemplary embodiments of the present invention;

FIG. 5 is a schematic illustration of the general structure of a back thinned electron bombardment CMOS image sensor which can be employed in various exemplary embodiments of the invention;

FIG. 6 is a schematic illustration of a back thinned CMOS image sensor which can be employed in various exemplary embodiments of the invention;

FIG. 7 is a schematic illustration of the operation of the optical detection device in a preferred embodiment in which electron bombardment image sensor is employed;

FIG. 8 is a flowchart diagram describing a method suitable for detecting light, according to various exemplary embodiments of the present invention;

FIG. 9 is a flowchart diagram describing a method suitable for manufacturing an optical detection device, according to various exemplary embodiments of the present invention;

FIG. 10 is block diagram illustrating a model for simulating collection of secondary electrons, according to various exemplary embodiments of the present invention;

FIG. 11 is block diagram illustrating a model for simulating a CMOS image sensor, according to various exemplary embodiments of the present invention;

Figure 12:
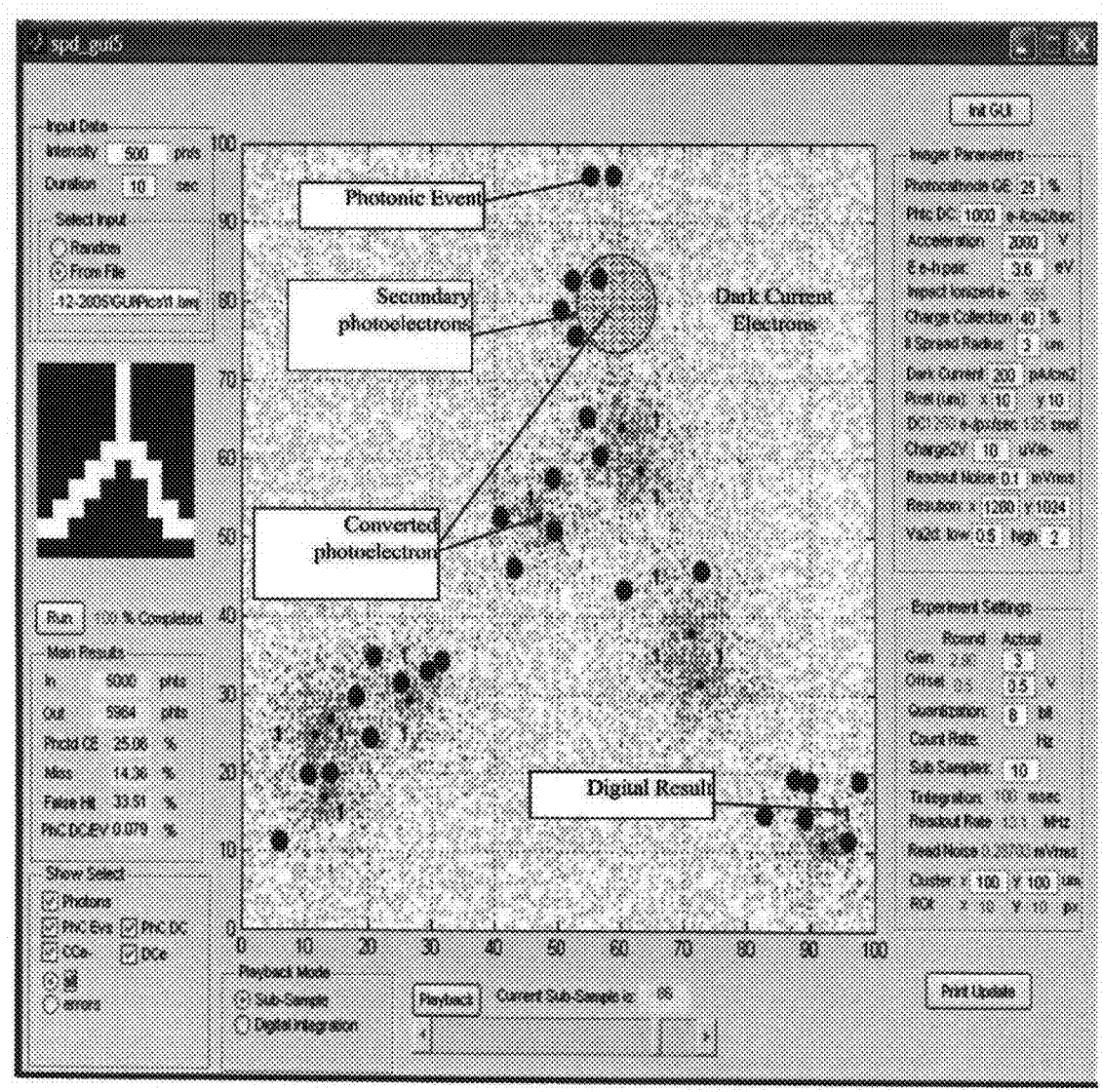
Figure 13:
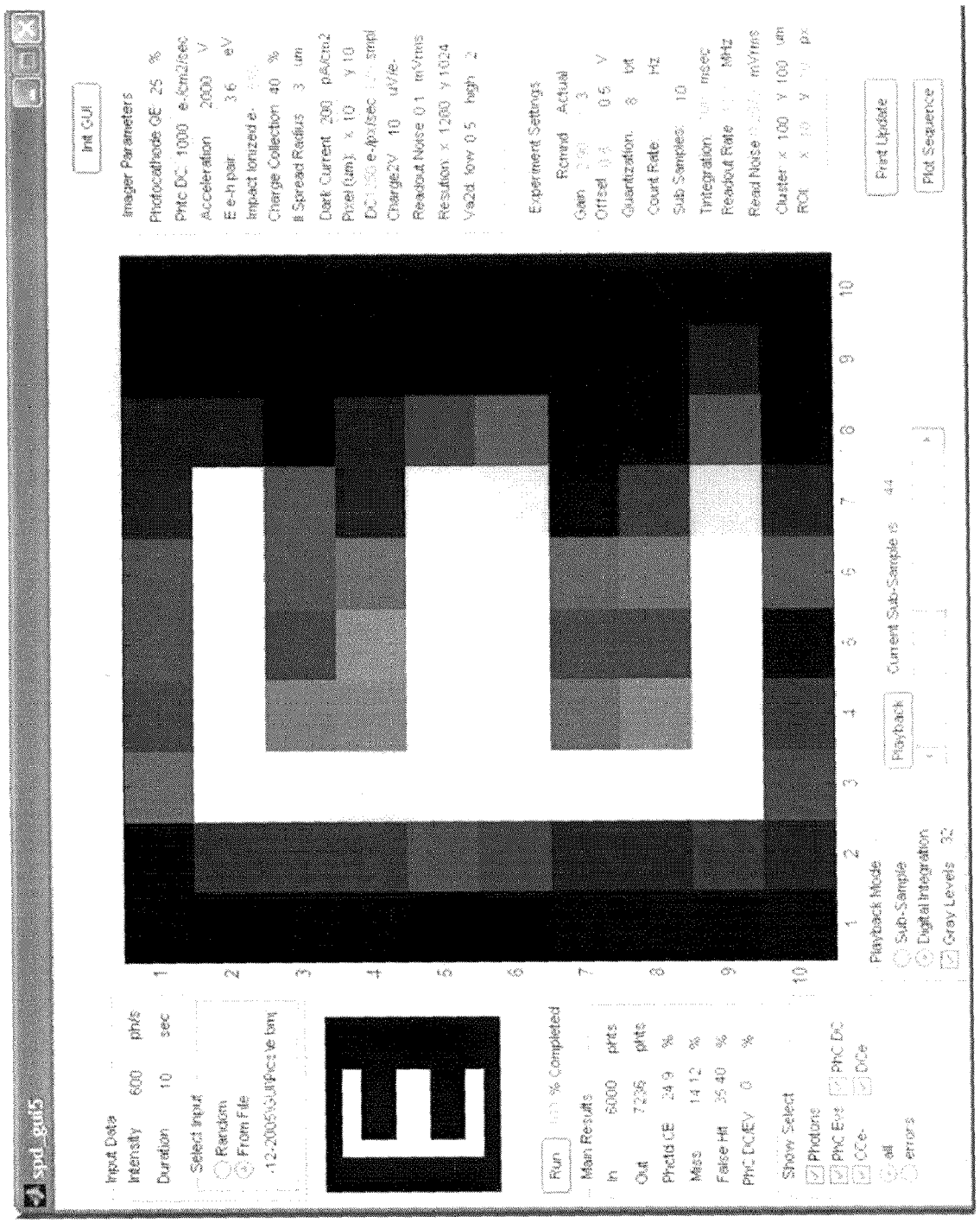
Figure 14:
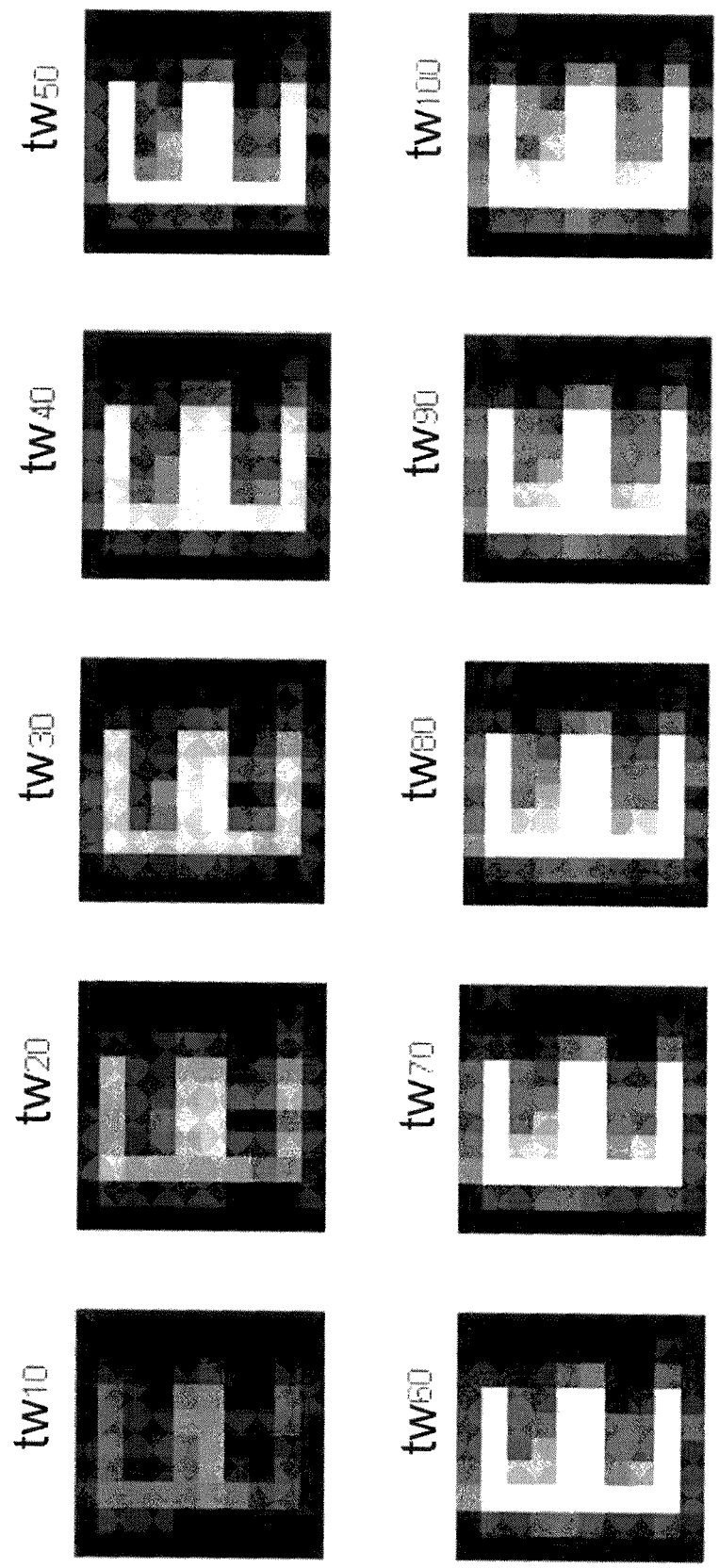
Figure 15:
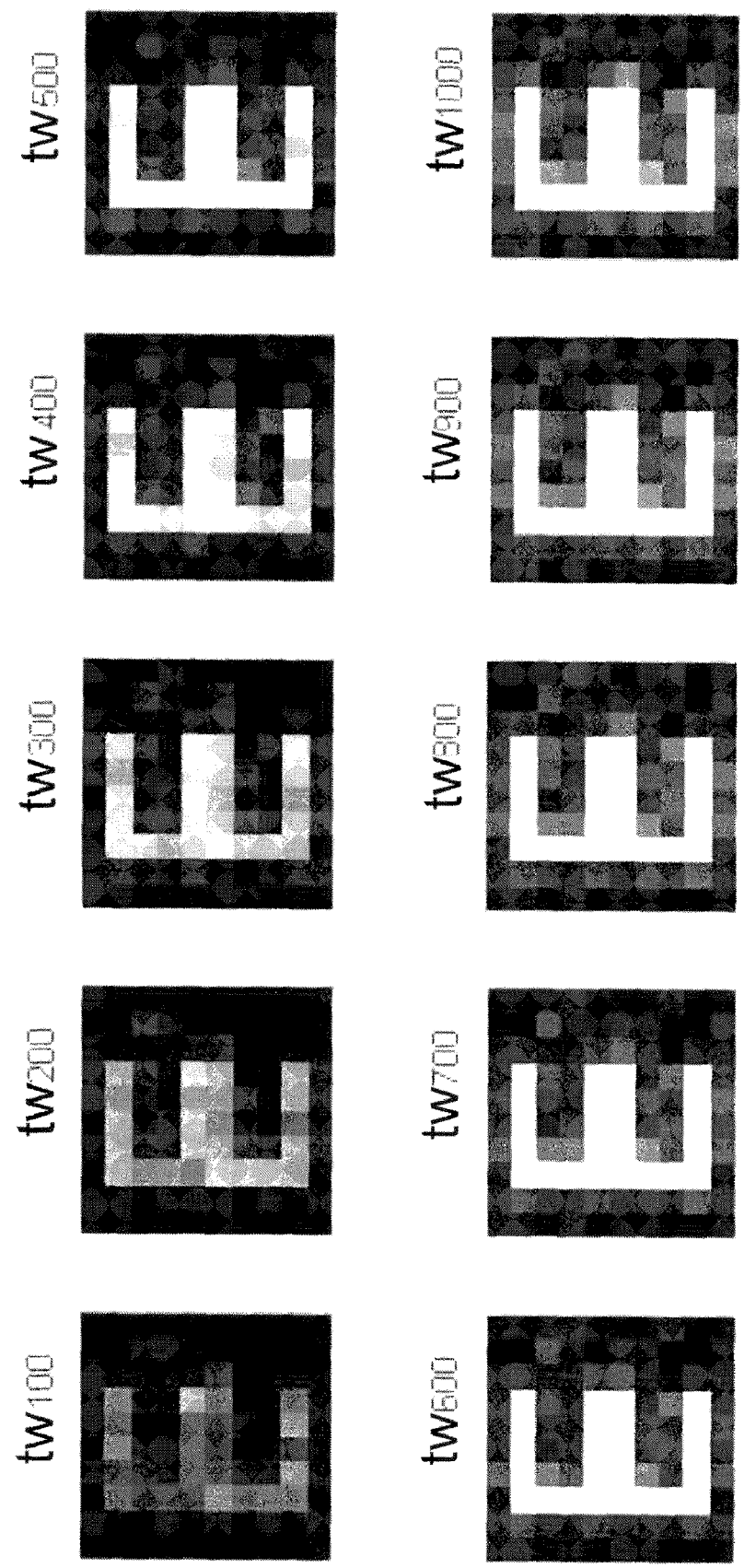
Figure 16:
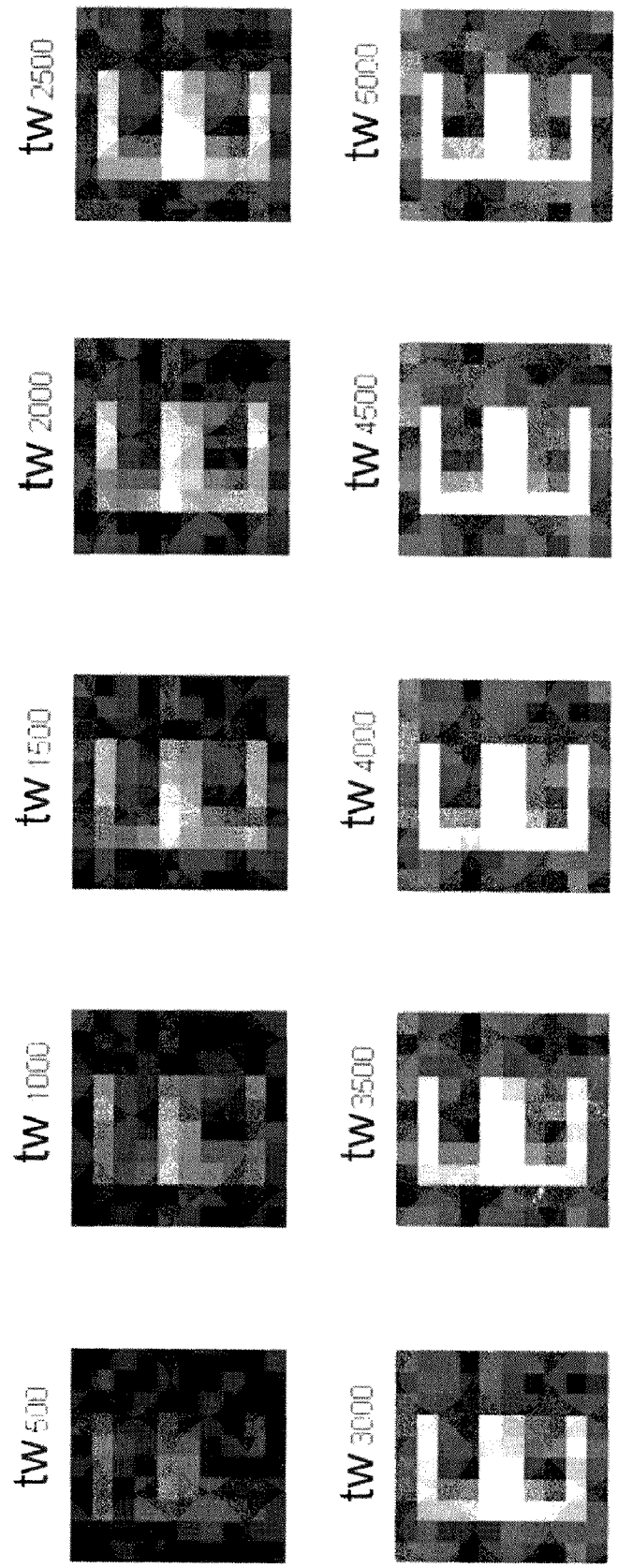

FIG. 12 shows a graphical user interface (GUI) in a time-window mode, as used during the simulations;

FIG. 13 shows a GUI in a digital integration mode, as used during the simulations;

FIG. 14 shows simulation results for irradiance of 600 photons per second per 2,400 $\mu m^2$, according to a preferred embodiment of the present invention;

FIG. 15 shows simulation results for irradiance of 60 photons per second per 2,400 $\mu m^2$, according to a preferred embodiment of the present invention; and FIG. 16 shows simulation results for irradiance of 6 photons per second per 2,400 $\mu m^2$, according to a preferred embodiment of the present invention.

DESCRIPTION OF THE PREFERRED EMBODIMENTS

The present embodiments comprise a method, device and system which can be used for optical detection. Specifically, but not exclusively, the present embodiments can be used to detect weak optical signals. The present embodiments can be employed in various optical applications including, without limitation, still imaging of static or dynamic objects and light conditions, video imaging and optical sensing for various applications, such as, but not limited to, light level detection, object detection, proximity detection, motion detection, chemical analysis, temperature measurement and the like.

The principles and operation of method, device and system according to the present invention may be better understood with reference to the drawings and accompanying descriptions.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Figure 1:
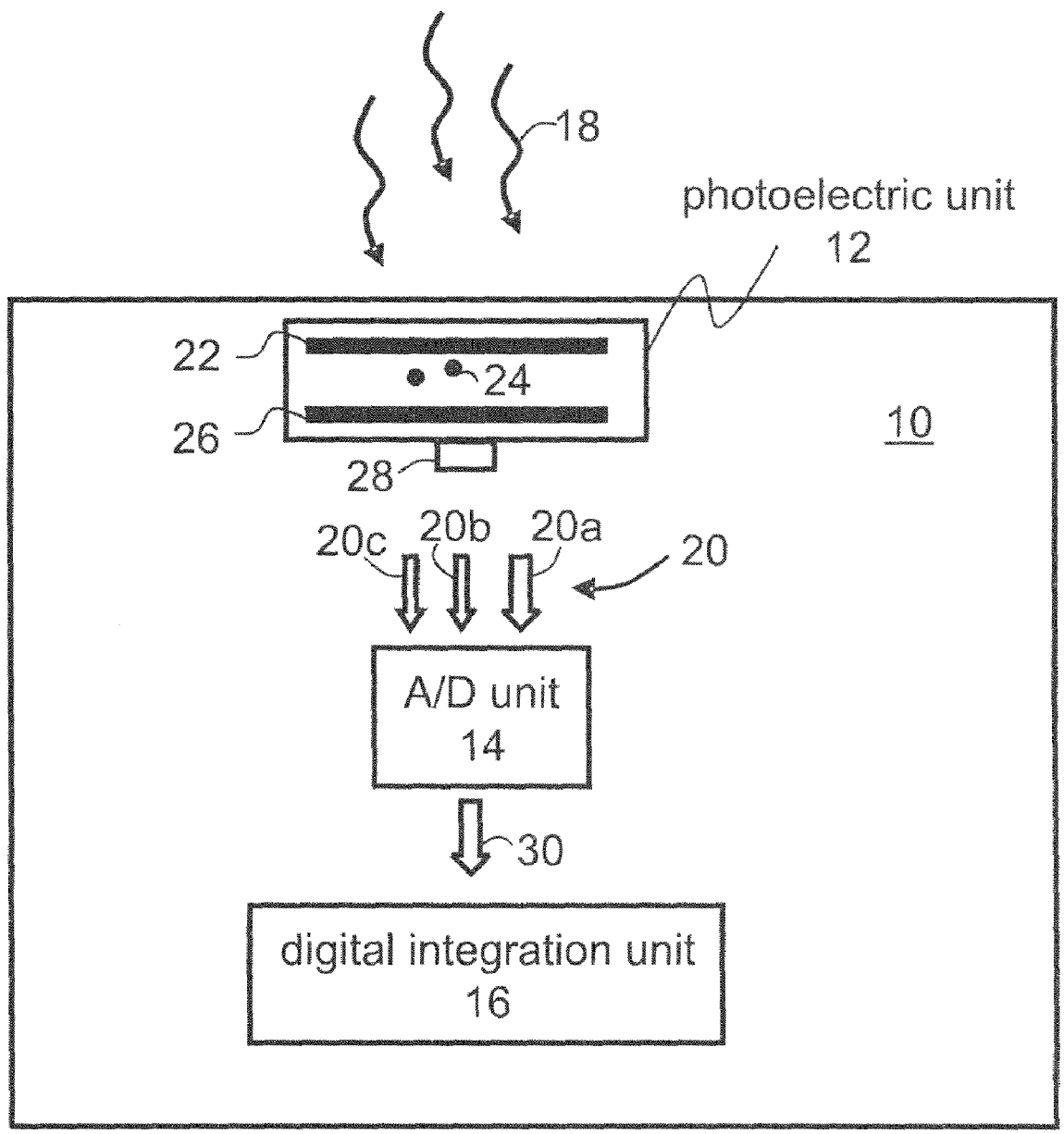

Referring now to the drawings, FIG. 1 illustrates an optical detection device 10, according to various exemplary embodiments of the present invention. Device 10 comprises a photoelectric unit 12, an analog-to-digital (A/D) unit 14 and a digital integrating unit 16.

In operation, photoelectric unit 12 senses incoming photons 18 and produce electrical signals pertaining to at least a few of the photons. The produced electric signals are generally shown at 20. Specifically, unit 12 comprises a photocathode 22 which absorbs energy from the incoming photons and, via the quantum-mechanical photoelectric effect, emits in response electrons 24, which are accelerated towards an anode device 26 and converted to electric signals by an appropriate electronic circuitry 28. In addition to the signals resulting from the conversion of photoelectrons, electric signals 20 generally includes also noise contributions, such as the so called dark current and/or readout noise.

The term "dark current", as used herein refers to current generated by anode device 26 and/or circuitry 28 in the absence of electronic events. False electronic events, whereby photoelectrons are emitted from photocathode 22 in the absence of photonic events, are assumed to be negligible.

The term "readout noise", refers to noise introduced during the process in which circuitry 28 reads the charges induced by the photoelectrons and converts them to an analog signal.

The signals which result from the conversion of photoelectrons are also referred to as "secondary electrons". Thus, as shown in FIG. 1, unit 12 produces electric signals which typically comprise a secondary electrons contribution $20a$, a dark current contribution $20b$ and a readout noise contribution $20c$.

Circuitry 28 of photoelectric unit 12 preferably controls various timing parameters such as, but not limited to, exposure time interval and gating time interval. A more detailed description of circuitry 28 according to preferred embodiments of the present invention is provided hereinunder.

The produced electrons are oftentimes called "photoelectrons", alluding to the fact that they are produced in response to the absorption of photons. The probability of unit 12 to produce a photoelectron is known as the quantum efficiency of the photoelectric unit. The quantum efficiency can be expressed either as a fraction or as percentage. For example, when the quantum efficiency is 0.5 (or equivalently 50%), the number of emitted photoelectrons is about half of the number of absorbed photons.

Figure 2:
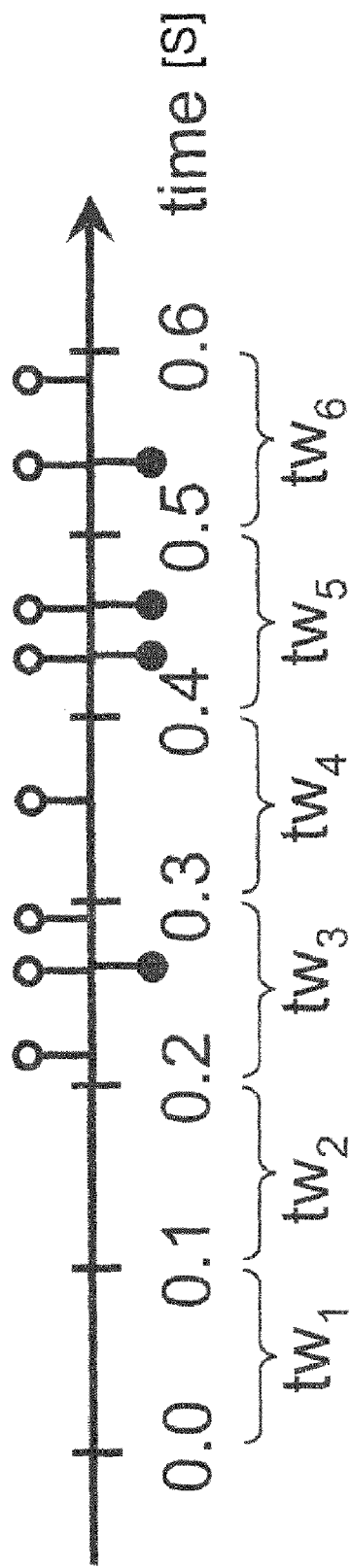

Unit 12 preferably produces electrical signals 20 within a plurality of temporally resolved time-windows. This can be better understood from the exemplified illustration of FIG. 2, showing incoming photonic events (i.e., absorption of photons by the photocathode) and corresponding electronic events (i.e., emission of photoelectrons by the photocathode) on a time axis. The photonic events are illustrated in FIG. 2 by open circles and the electronic events are illustrated by full circles. Shown in FIG. 2 is an overall time interval of 0.6 second, which is equally subdivided into 6 time-windows $tw_1, tw_2, \ldots, tw_6$. The width (duration) of the time-windows (0.1 second each in the present example) is controlled by circuitry 28.

In various exemplary embodiments of the invention the widths of the time-windows are selected sufficiently narrow such that a current characterizing secondary electrons contribution $20a$ is higher than dark current contribution $20b$. Further reduction of the dark current contribution can be achieved by controlling the exposure time.

Referring again to the illustration in FIG. 2, there are eight photonic events which occur during the overall 0.6 second time-interval: three events occur during time-window $tw_3$, one during time-window $tw_4$, two during time-window $tw_5$ and two during time-window $tw_6$. Four of the eight photonic events (the second event in $tw_1$, both events in $tw_5$ and the first event in $tw_6$) are followed by an electronic event. As will be appreciated by one of ordinary skill in the art, the present illustration is an example of a 50% quantum efficiency. Circuitry 28 thus produces electrical signals within time-windows $tw_3$, $tw_5$ and $tw_6$, but the level of the signals produced during $tw_5$ is higher than the level of the signals produced during $tw_3$ and during $tw_6$, because the signals produced during $tw_5$ correspond to two electronic events while the signals produced during $tw_3$ and during $tw_6$ correspond to one electronic event.

Figure 3:
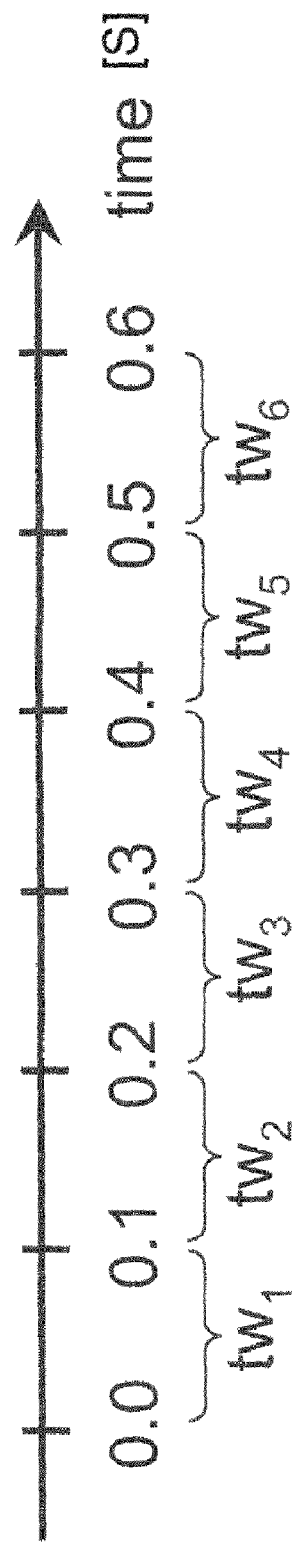

A/D unit 14 receives the electrical signals and generates a digital representation 30 thereof. Thus, in the exemplified illustration of FIG. 2, unit 14 can generate, for example, the following digital representation: "0", "0", "1", "0", "2", "1", corresponding to $tw_1$ through $tw_6$, respectively. This is better illustrated in FIG. 3 showing that unit 14 can generate "0" during $tw_1$, $tw_2$ and $tw_4$ (corresponding to lack of electronic events during these time-windows), "1" during $tw_3$ and $tw_6$ (corresponding to one electronic event during each of these time-windows), and "2" during $tw_5$ (corresponding to the two electronic events). Other digital representations are not excluded from the scope of the present invention.

Preferably, A/D unit 14 is calibrated to exclude certain contributions such as dark current and/or readout noise from the digital representation. Thus, in cases in which a dark current component and/or readout noise accompany the signals which correspond to electronic event, such dark current component and/or readout noise is preferably represented as zero in the digitization performed by A/D unit, and is therefore excluded. Such exclusion can be ensured by calibrating the quantization resolution, gain and/or offset of unit 14. Preferably, at least one of the quantization resolution and gain of unit 14 is selected such that the secondary electron contribution is amplified to the least significant bit level of the digitization.

Digital integrating unit 16 receives digital representation 30 from unit 14 and integrates the digital representation over at least part of the time-windows, so as to provide integrated data corresponding to the incoming photons. Digital integration is a well known procedure in which the value of the ith digital sample is added to the integration value of the previous digital sample to generate the current integration value. In the representative example illustrated in FIGS. 2-3, the result of the digital integration is 0+0+1+0+2+1=4 in accordance with the number of electronic events. Knowing the quantum efficiency of photoelectric unit 12, the number of photonic events can be statistically calculated.

In various exemplary embodiments of the invention a decision is made to determine whether or not enough samples have been accumulated. If not, the digital integration proceeds, if enough samples have been accumulated, the digital integration can be terminated. Since the value of the digital integration pertains to the number of photonic events, device 10 successfully provides indication of the presence and level of light. Since A/D unit substantially exclude dark current and/or readout noise, device 10 can detect weak optical signals.

Device 10 can thus serve as a component in an optical sensor, preferably of high sensitivity, e.g., sufficiently sensitive to sense a few photons, more preferably a single photon. The optical sensor of the present embodiments can be employed in various systems including, without limitation, an object detection system, a motion detection system, a proximity detection system, a temperature measuring system, a photon counting system (e.g., a parallel photon counting system), and the like.

Figure 4:
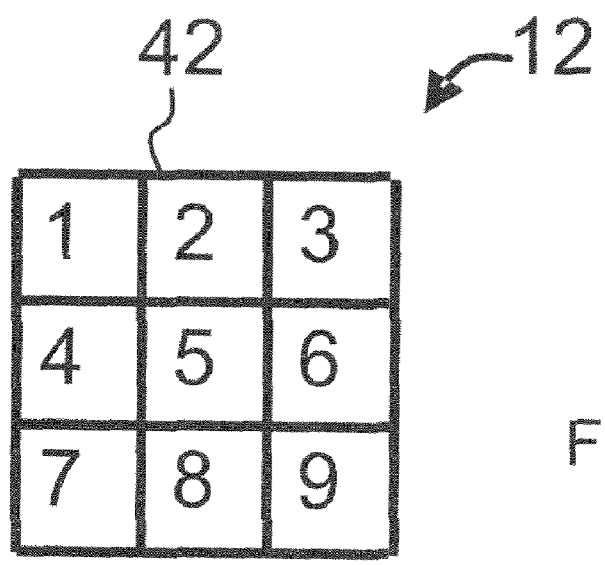

FIG. 4 is a schematic illustration of anode device 26 in a preferred embodiment in which the collection area of anode device 26 is dividable into a plurality of spatially resolved locations 42. For example, anode device 26 can include a charge-coupled devices (CCD) or complementary metal oxide semiconductor (CMOS) image sensor having a two-dimensional array of pixels defined thereon. In this embodiment, each location 42 of anode device 26 can correspond to a single pixel or a bin of pixels. For clarity of presentation, FIG. 4 shows a spatially resolved location which is subdivided to nine sub-locations numerated from 1 to 9, but it is not intended to limit the scope of the present invention to any specific number of spatial locations or sub-locations.

The spatially resolved locations can be exploited for generating a digital image of the object emitting or reflecting incoming photons 18. According to a preferred embodiment of the present invention digital representation 30 is generated separately for each spatially resolved location. This can be done in more than one way.

In one preferred embodiment, the digital representation is performed sequentially, namely A/D unit 14 generates a digital representation of electrical signals received from the first spatial location (if such signals exist), then generates a digital representation of electrical signals received from the second spatial location and so on.

In another preferred embodiment, the digital representation is performed concurrently, namely A/D unit 14 generates a digital representation of electrical signals received from many spatial locations at the same time. In this embodiment, unit 14 comprises a plurality of A/D converters each designated for receiving analog signals from a different spatial location.

Also contemplated is a combination of the above techniques whereby unit 14 concurrently generates a digital representation of electrical signals received from a first group of spatial locations (e.g., a row), then generates a digital representation of electrical signals received from a second group of spatial locations and so on.

Following is a description of the operation of device 10 in a preferred embodiment in which the collection area of anode device 26 comprises a plurality of spatially resolved locations. The description is by way of a simplified example which corresponds to the photonic and electronic events shown in FIG. 2, the digital representation described above in connection to FIG. 3, and the nine sub-locations illustrated in FIG. 4. Specifically, in the present example the single electronic event of $tw_3$ is collected at sub-location No. 1, the two electronic event of $tw_5$ are collected at sub-location No. 6, and the single electronic event of $tw_6$ is collected at sub-location No. 8 (cf. FIG. 2). A/D unit 14 preferably digitizes the spatial location as follows: for sub-location No. 1 unit 14 generates a "1" at $tw_3$ and zeros for all other time-windows, for sub-location No. 6 unit 14 generates a "2" at $tw_5$ and zeros for all other time-windows, for sub-location No. 8 unit 14 generates a "1" at $tw_6$ and zeros for all other time-windows, and for sub-locations Nos. 2, 4, 5, 7 and 9 unit 14 generates zeros, as summarized in Table 1, below:

TABLE 1

| time-window | sub-location | | | | | | | | |
|---|---|---|---|---|---|---|---|---|---|
| | 1 | 2 | 3 | 4 | 5 | 6 | 7 | 8 | 9 |
| $tw_1$ | 0 | 0 | 0 | 0 | 0 | 0 | 0 | 0 | 0 |
| $tw_2$ | 0 | 0 | 0 | 0 | 0 | 0 | 0 | 0 | 0 |
| $tw_3$ | 1 | 0 | 0 | 0 | 0 | 0 | 0 | 0 | 0 |
| $tw_4$ | 0 | 0 | 0 | 0 | 0 | 0 | 0 | 0 | 0 |
| $tw_5$ | 0 | 0 | 0 | 0 | 0 | 2 | 0 | 0 | 0 |
| $tw_6$ | 0 | 0 | 0 | 0 | 0 | 0 | 0 | 1 | 0 |

It is appreciated that generally the number of events at each spatial location depends on the area of the location. In various exemplary embodiments of the invention the spatially resolved location are judiciously selected so as to increase the signal-to-noise ratio while allowing collection of a sufficient number of events. More specifically, the area of each spatially resolved location is selected sufficiently small such that the current characterizing the secondary electrons contribution is higher than the dark current and/or readout noise contributions of unit 12. Further reduction of the dark current contribution can be achieved by controlling the exposure time, as further detailed hereinunder (see, e.g., Equation 1 in the Examples section that follows).

A spatial location of a few pixels (e.g., 3×3 pixels and above) is preferred when the light conditions are not too low (say at least few tens of photons per second over an area of a few thousands square micrometers), because it allows to collect sufficient number of events at a sufficiently short time interval. Selection of smaller spatial locations (e.g., 2×2 pixels or a single pixel) is preferred for very low light conditions (e.g., a few photons or less per second over an area of a few thousands square micrometers). As will be appreciated by one of ordinary skill in the art, when the spatial location includes a single pixel it cannot be subdivided because such subdivision would exceed the resolution of unit 12. The operation of device 10 when the spatial locations are subdivided is referred to herein as the "binning mode" and the operation without subdivision is referred to as "elementary mode".

Integration unit 16 preferably performs the digital integration per location so as to allow spatial division of the information. In the present example, the digital integration for spatial location Nos. 1, 6 and 8 is 1, 2 and 1, respectively, and the digital integration for all other spatial locations is zero.

Digital information of several nearby spatial locations can also be combined after the digital integration, to effect spatial integration of digital data. This is particularly useful when the elementary mode is employed. Thus, a bin of nearby spatial locations can be defined at the digital level so as to collect sufficient digital data. Since spatial locations which only include dark current contribution are digitized to zero, such "post digitization binning" allows collecting more data substantially increasing the dark current contribution.

Suppose, for example, that device 10 operates in the elementary mode and the photonic and electronic events are as described above. In this case, the configuration shown in FIG. 4 can correspond, without limitation, to nine spatial locations each being composed of a single pixel (as oppose to a binning mode in which such configuration corresponds to, e.g., one spatial location composed of nine pixels). Once digitization and integration is performed, each pixel is associated with an integrated value. In the above example, the integrated value is 1 for pixel Nos. 1 and 8, 2 for pixel No. 6, and 0 for all other pixels. The sum of integrated values of all the nine pixels is 4. Such summation corresponds to a spatial integration of digital data. Combining digital integrated values of several spatial locations is advantageous because it increases the sensitivity of the device and allows reducing the exposure time. Thus, according to the presently preferred embodiment of the invention the digital integrated values of a group of nearby locations are combined so as to increase the sensitivity of the device. This embodiment is particularly useful, for example, for parallel photon counting applications for high throughput micro-arrays.

Knowing the quantum efficiency of photoelectric unit 12, the number of photonic events can be statistically calculated for each spatial location or group of spatial locations. In various exemplary embodiments of the invention the integration continues until at least a few of the locations is assigned with a predetermined digital value. Since the value of the digital integration pertains to the number of photonic events for each location, device 10 successfully provides an image of the object which emits or reflects the incoming photons. It was found by the Inventors of the present invention that device 10 can be used for providing images of static as well as moving objects, at constant as well as varying light conditions. The image provided by device 10 can be a stills image or a video image. Since dark current and/or readout noise are substantially excluded during digitization, device 10 can provide the image even at low light conditions.

Thus, device 10 can be employed in a stills camera, a video camera, a night vision apparatus and the like.

Following is a description of photoelectric unit 12, according to various exemplary embodiments of the present invention. Unit 12 preferably comprises an intensifier for multiplying the produced photoelectrons. The degree of intensification, also referred to as electron gain, is typically controlled by circuitry 28 and is preferably tunable. In various exemplary embodiments of the invention the intensification is selected such that the current characterizing the secondary electrons contribution is higher than the readout noise contribution.

Preferably, but not obligatorily, the electron bombardment effect is employed for intensification. It is to be understood, however, that a more detailed reference to electron bombardment image sensors in the embodiments described below is not to be interpreted as limiting the scope of the invention in any way. Further, while the embodiments below are described with a particular emphasis to an image sensor of the CMOS type, it is not intended to limit the scope of the invention to CMOS image sensors. Thus, for example, unit 12 can include an image sensor of the charge coupled type.

Figure 5:
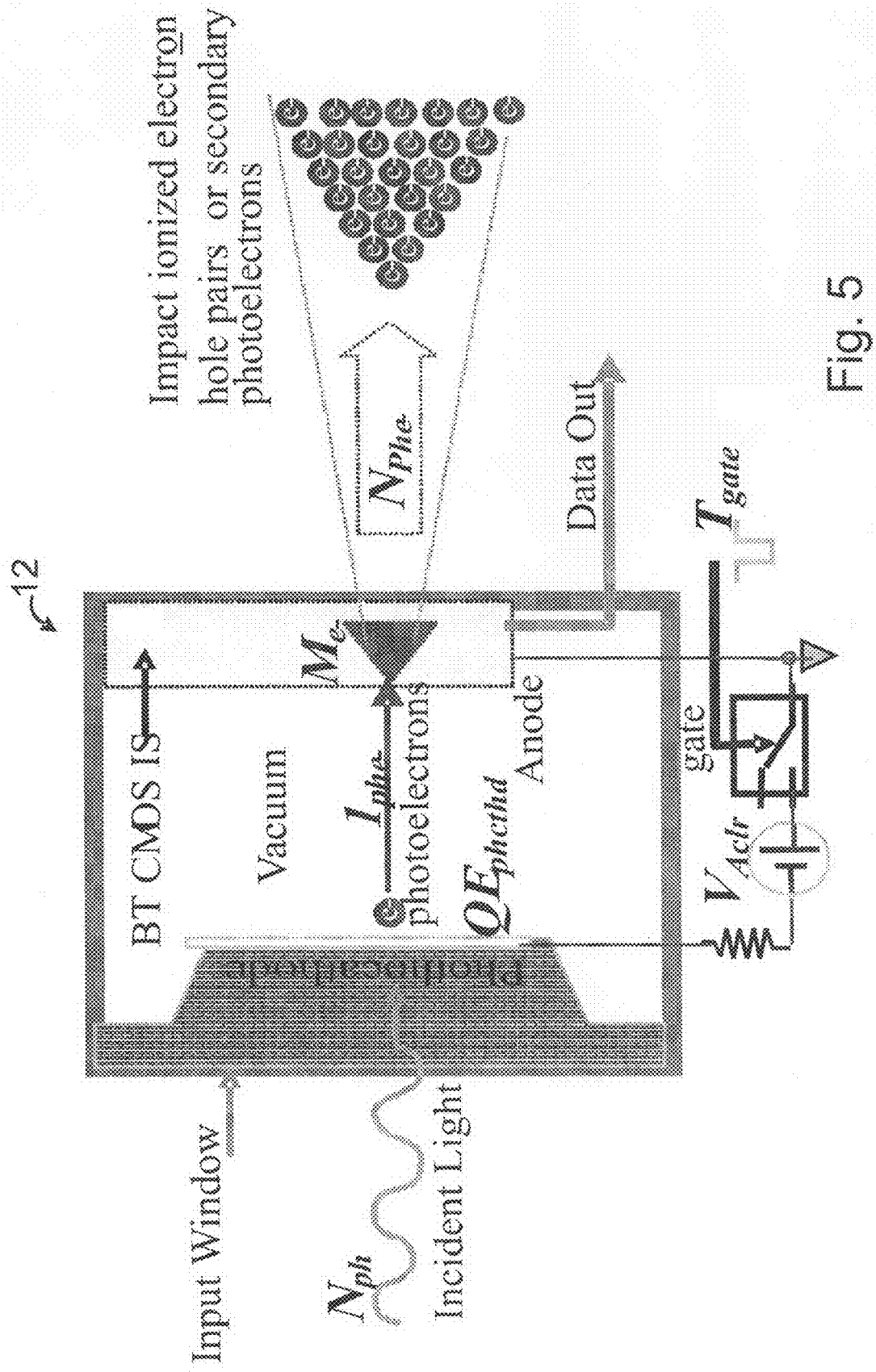

FIG. 5 is a schematic illustration of the general structure of a back thinned electron bombardment CMOS image sensor. The photocathode is in proximity focus with a back thinned CMOS image sensor which forms the anode device. The photocathode and anode device are encapsulated into a vacuum enclosure. In response to incident light, the photoelectrons emitted from the photocathode (with Quantum Efficiency $QE_{phcthd}$), are accelerated by an applied voltage $V_{Aclr}$ to sufficient energy to allow electron gain $M_{e^-}$. The acceleration voltage is negative with respect to the chip permitting biasing to be near ground potential for easy interfacing with other components. The gating operation is performed by enabling $V_{Aclr}$ voltage pulse for time $T_{gate}$ to the gate that is normally OFF. Any architecture of CMOS image sensors can be employed. A back thinned and back illuminated architecture is preferred.

Figure 6:
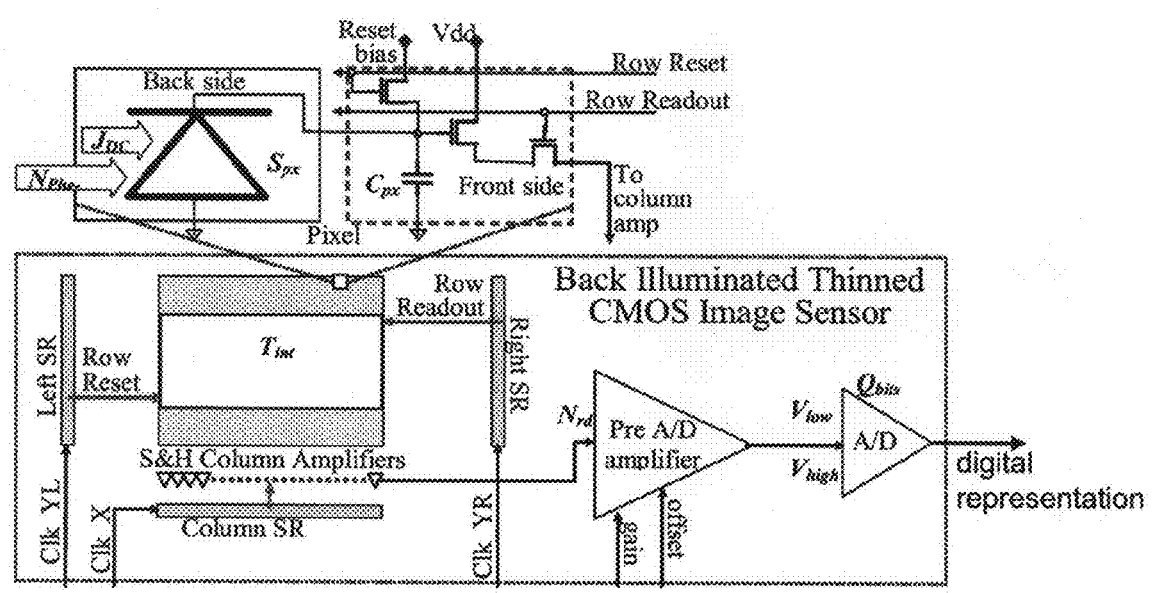

FIG. 6 illustrate an exemplary architecture of a back thinned CMOS image sensor. In the representative illustration of FIG. 6, the active pixel sensor is of the 3 transistor photodiode type. The image sensor has an active pixel array managed by a logic timing and control circuitry. The back thinned architecture allows utilization of complete pixels area to collect impact ionized, or secondary, photoelectrons since the pixels electronics is located on the front side. Each pixel has an area of $S_{px}$ and consists of a capacitor $C_{px}$ which is pre-charged to a reset bias voltage, a photodiode discharging the capacitor and three MOS transistors for pixel reset, signal sensing and leading to column amplifier, respectively. As shown, the image sensor further includes three registers: a left shift register, a right shift register and a column shift register. The left register points to the row that is pre-charged to reset bias voltage and the right register points to the sampled row. The left register feeds a "sample and hold" (S&H) column amplifier. The area defined between the pointers of the left and right registers determines the exposure time, or the so called "analog integration time" denoted $T_{int}$. In various exemplary embodiments of the invention the analog integration time is selected so as to reduce dark current contribution. The column shift register selects the S&H column amplifier and feeds a pre A/D amplifier. The Pre A/D amplifier has tunable gain and offset which can be tuned to fit the input signal range (designated $V_{low}$ and $V_{high}$) of the A/D converter. The A/D converter provides the digital representation in accordance with the quantization resolution $Q_{bits}$.

Broadly speaking, there are dark counts due to the dark current $J_{DC}$ of the photocathode. Thus, in various exemplary embodiments of the invention the photocathode is selected such that the dark counts associated with it are low, typically about 1000 counts per second per square centimeter.

As used herein the term "about" refers to ±10%.

Such types of photocathode are known in the art and include, without limitation, photocathode of the GaAs, Bi-alkali or Multi-alkali type.

Figure 7:
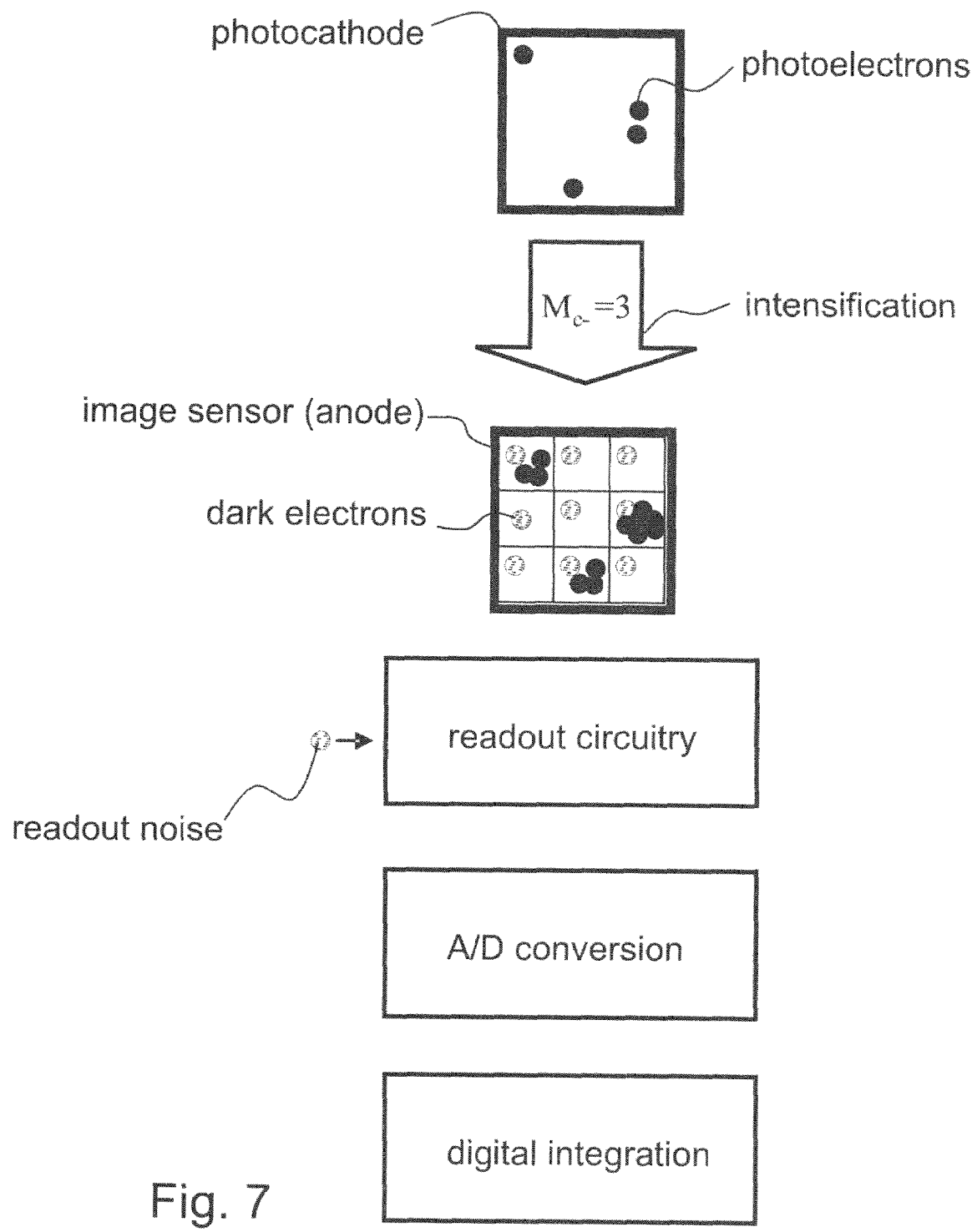

FIG. 7, illustrates the operation of the device 10 in a preferred embodiment in which electron bombardment image sensor is employed. By way of example, the parameters of the image sensor include, nine spatial location (cf. FIG. 4), quantum efficiency $QE_{phcthd}$ of 50%, electron gain $M_{e^-}$ of 3, overall image sensor dark count $N_{DC}$ of 90 electrons per second per unit area, and readout noise $N_{rd}$ of one electron. For simplifying the description, the electron gain, dark current and readout noise are treated as constant parameter, omitting their statistical nature. A more rigorous treatment is provided in the Examples section that follows.

The description corresponds to the photonic and electronic events described above in connection with FIGS. 2 and 4. The photoelectrons produced by the photocathode are multiplied and bombard the image sensor (anode device). Additionally, the image sensor generates dark electrons. For an $N_{DC}$ value of 90 electrons per second per unit area, the image sensor generates, on the average, about 9 electrons during a time-window of 0.1 seconds. Since there are nine spatial locations, the average number of dark electrons per spatial location is one. The readout circuitry of the image sensor feeds the A/D unit with the charge of dark current and the secondary electrons. During this process the readout noise is superimposed on the output of the readout circuitry for each spatial location.

The gain and an offset values of the pre-A/D amplifier are preferably selected such as to calibrate the analog to digital conversion as follows: input level of 0 to 2 electrons corresponds to digital output of "0", input level of 3 to 5 electrons corresponds to digital output of "1", input level of 6 to 8 electrons corresponds to digital output "2", and so on. As will be appreciated by one ordinarily skilled in the art, such calibration transfers the dark current and readout noise to zero in the digital domain thus eliminating their contribution and providing the digital representation summarized in Table 1 above.

Figure 8:
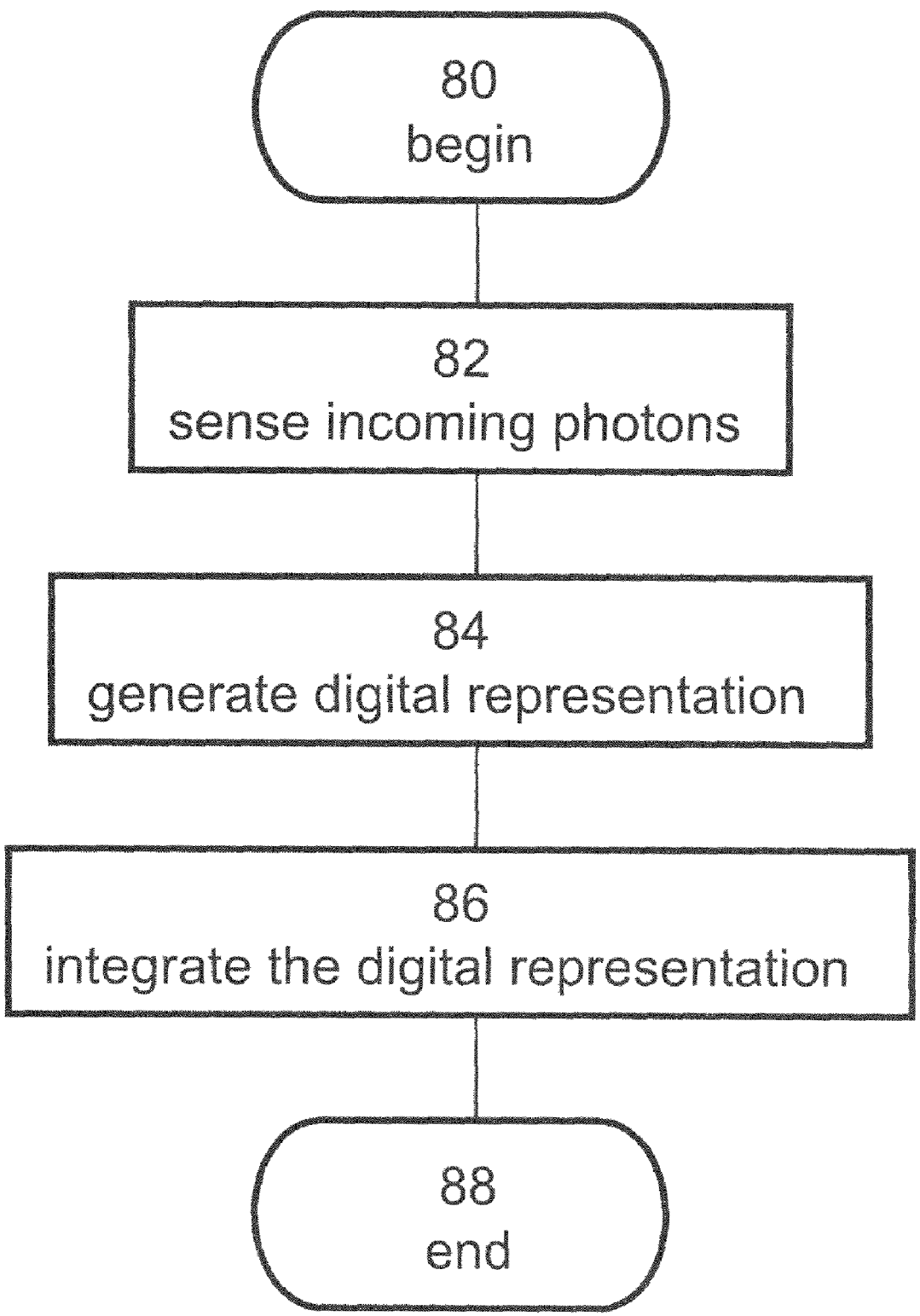

Reference is now made to FIG. 8 which is a flowchart diagram describing a method suitable for detecting light. The method can be executed by operating device 10. The method begins at step 80 and continues to step 82 in which a photoelectric unit is used for sensing incoming photons and providing electrical signals pertaining to at least a few of photons, within a plurality of temporally resolved time-windows. The photoelectric unit is preferably dividable into a plurality of spatially resolved locations as further detailed hereinabove. The method continues to step 84 in which a digital representation of the signals is generated, preferably so as to exclude dark current and readout noise. From step 84 the method proceeds to step 86 in which the digital representation is integrated as described above.

The method ends at step 88.

Figure 9:
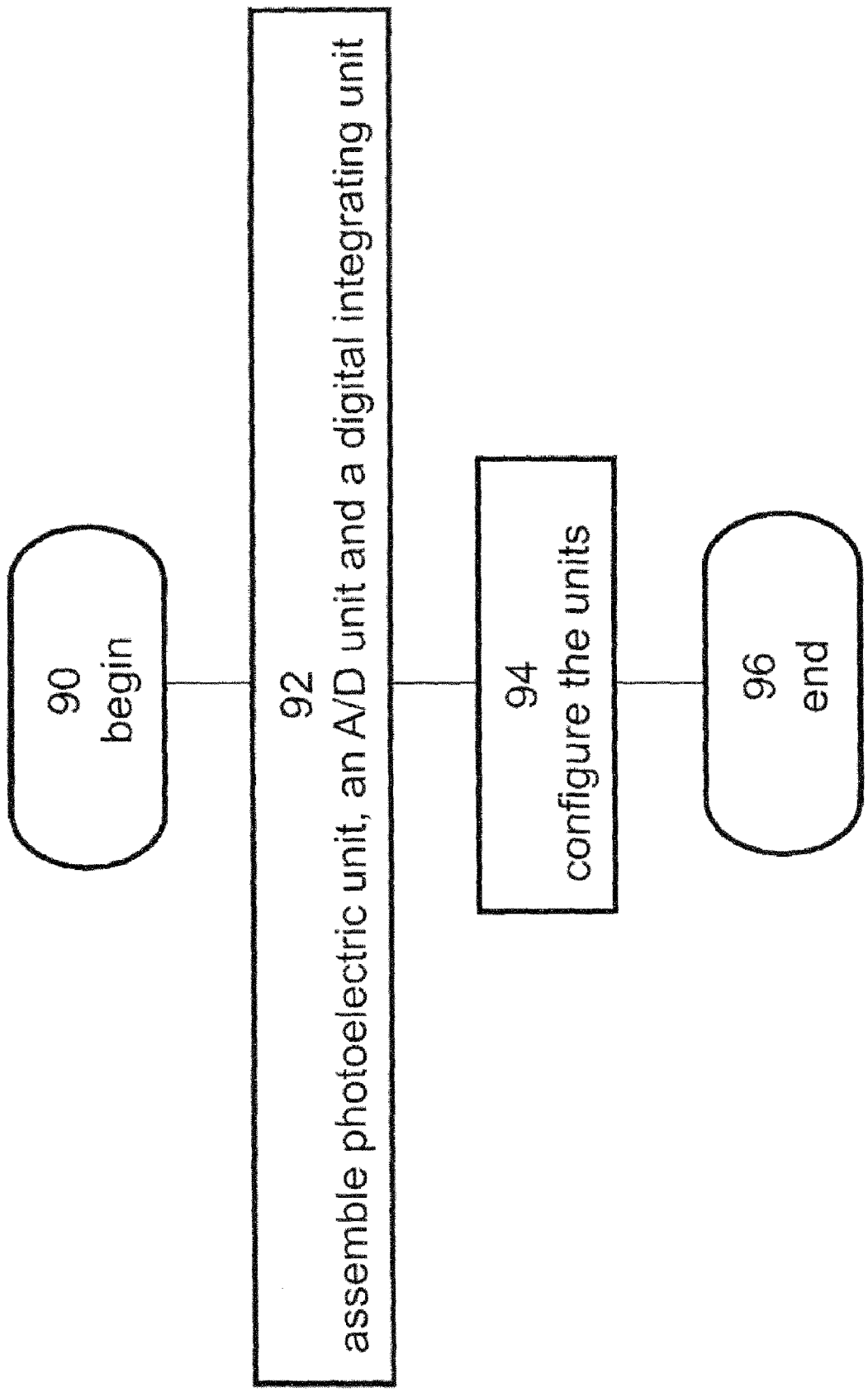

FIG. 9 is a flowchart diagram describing a method suitable for manufacturing an optical detection device, such as device 10. The method begins at step 90 and optionally and preferably continues to step 92 in which a photoelectric unit, an A/D unit and a digital integrating unit are assembled. This can be done in using any technique known in the art. The method continues to step 94 in which the photoelectric unit, A/D unit and digital integrating unit are configured such that the photoelectric unit senses the incoming photons and produces electrical signals within a plurality of temporally resolved time-windows, the A/D unit generates the digital representation, and the digital integrating unit integrates the digital representation, as further detailed hereinabove. Step 94 of the method can be executed irrespectively whether or not optional step 92 is executed. Specifically, an assembled device can be provided and configured by executing step 94 of the method.

The method ends at step 96.

Additional objects, advantages, and novel features of the present invention will become apparent to one ordinarily skilled in the art upon examination of the following examples, which are not intended to be limiting. Additionally, each of the various embodiments and aspects of the present invention as delineated hereinabove and as claimed in the claims section below finds experimental support in the following examples.

EXAMPLES

Reference is now made to the following examples, which together with the above descriptions, illustrate the invention in a non limiting fashion.

Example 1

Operational Settings

The present Example demonstrates operational settings for a device which includes an electron bombardment CMOS image sensor, according to various exemplary embodiments of the present invention. Typical ranges of values for various parameters of CMOS technology in general and electron bombardment CMOS image sensors in particular electron bombardment image sensors are listed in Table 2, below.

TABLE 2

| Parameter | Symbol | Typical Value |
| --- | --- | --- |
| mean photocathode QE | $QE_{phcthd}$ | 10-50% |
| mean dark count of the photo-cathode at room temperature | $J_{phtcthdDC}$ | 1000 e-/cm$^2$/s |
| acceleration voltage | $V_{aclr}$ | 2,000 V |
| mean impact ionization quantum energy for single electron-hole pair [e-h] | $E_{II}$ | 3.6 eV |
| standard deviation of impact ionization spread radius | $R_{II}$ | 1 μm |
| mean charge collection efficiency | CCE | 40% |
| pixel dimensions | $D_{px}$ | 10-50 μm$^2$ |
| mean dark current density at room temperature | $J_{DC}$ | 100-2,000 pA/cm$^2$ or 6-125 e-/s/μm$^2$ |
| standard deviation of unit readout noise (10 MHz) | $V_{rd}$—base | 40-700 $\mu V_{RMS}$ |
| mean charge to voltage conversion | C2V | 1-80 μV/e- |
| resolution | $N_X \times N_Y$ | 1280 × 1024 pixels |
| A/D input voltage low | $V_{A2Dlow}$ | 0.5 V |
| A/D input voltage high | $V_{A2Dhigh}$ | 2 V |

Table 3 below lists a selection of programmable operational parameters of the image sensor, according to various exemplary embodiments of the present invention.

TABLE 3

| Parameter | Symbol | Typical Value |
| --- | --- | --- |
| gating time interval | $T_{gate}$ | 1-500 ms |
| analog integration time | $T_{int}$ | 1-500 ms |
| quantization resolution | $Q_{bits}$ | 8-10 bits |
| pre-A/D amplifier gain | $A_{gain}$ | 1-20 |
| pre-A/D amplifier offset | $V_{offset}$ | 0-2 V |

Generally, other parameters can also be tuned, but they can be set by a judicious selection of at least a few of the parameters listed in Table 3, as further demonstrated hereinunder. A list of such dependent parameter is provided in Table 4.

TABLE 4

| Parameter | Symbol |
| --- | --- |
| impact ionization gain | $M_{II}$ |
| collected secondary photoelectrons | $N_{se-}$ |
| pixel area | $S_{px}$ |
| pixels dark charge | $N_{DC}$ |
| readout frequency | $f_{rd}$ |
| resulted readout noise voltage | $V_{rd}$ |

The charge accumulated by the pixel due to the dark current is:

$$N_{DC}=J_{DC} \cdot T_{int} S_{px}, \quad \text{(EQ. 1)}$$

where the area of a (square) pixel is:

$$S_{px}=(D_{px})^2. \quad \text{(EQ. 2)}$$

The gating time interval, $T_{gate}$, is preferably similar to the analog integration time and can have any value from about 10 μs to 100 seconds. The preferred gating time is from about 1 ms to about 500 ms.

The analog integration time and gating time interval are preferably selected such that the collected dark current charge, $N_{DC}$, is half of the charge contributed by the collected secondary photoelectrons, $N_{se^-}$, generated during intensification:

$$N_{se^-} = M_{11} \cdot CCE, \quad (EQ. 3)$$

where, $$N_{DC} = 0.5 \cdot N_{se^-}. \quad (EQ. 4)$$

Using Equation 1, the preferred maximal width of the time-window (exposure time) is:

$$T_{int} = (M_{11} \cdot CCE)/(2 \cdot J_{DC} \cdot S_{px}), \quad (EQ. 5)$$

where the impact ionization gain $M_{11}$ depends on the accelerating voltage and the single electron-hole pair ionization energy:

$$M_{11} = V_{acb}/E_{11} \quad (EQ. 6)$$

The offset voltage of the Pre-A/D amplifier is preferably set to the minimal input voltage of the A/D:

$$V_{offset} = V_{A2Dlow} \quad (EQ. 7)$$

The quantization resolution of the A/D converter and the gain of the Pre-A/D amplifier gain are mutually dependent parameters. According to a preferred embodiment of the present invention the gain amplifies the voltage contributed by the charge of secondary photoelectrons to the least significant bit (LSB) level of the A/D input voltage:

$$V_{LSB} = ((M_{11} \cdot CCE) \cdot C2V) \cdot A_{gain}, \quad (EQ. 8)$$

where C2V is a charge to voltage conversion parameter of the image sensor. For linear A/D converter the LSB voltage can be expressed as:

$$V_{LSB} = (V_{A2Dhigh} - V_{A2Dlow})/2^{Qbits}, \quad (EQ. 9)$$

resulting in the following preferred expression for the gain:

$$A_{gain} = \left( \frac{V_{A2Dhigh} - V_{A2Dlow}}{2^{Qbits}} \right) / (M_{11} \cdot CCE \cdot C2V) \quad (EQ. 10)$$

A typical quantization resolution of an internal A/D converter in CMOS image sensors is 8 bits.

It is appreciated that typically a real photonic event is indistinguishable from dark counts of the photocathode. The noise evolved by such dark counts has a random spatial spread. The false detection of the photonic event due to the dark current of the photocathode has an average number that is proportional to the area, or region of interest (ROI) and to time during the digital integration interval (DII):

$$N_{phtcthdDC} = J_{phtcthdDC} \cdot A^{ROI} \cdot T_{DII} \quad (EQ. 11)$$

False detection of the photonic events can also occur due to high readout noise voltage, high positive fluctuation of the dark current, and/or high number of generated secondary photoelectrons.

The noise can also originate from mismatch of the photonic event. Such mismatch can occur in the case that the readout noise voltage is negative such that the resulted pixel voltage is below the level of the least significant bit. Additionally, the mismatch can occur due to the impact ionization by low number of secondary photoelectrons and/or spread of secondary photoelectrons over neighboring pixels.

The dark current accumulated by the pixel is preferably reduced by shortening the integration time, and, consequently, raising the readout frequency, $f_{rd}$, defined as:

$$f_{rd} = N_x \cdot N_y \cdot (1/T_{int}). \quad (EQ. 12)$$

Using the typical values for $N_x$, $N_y$ and $T_{int}$ the value of $f_{rd}$ is from about 2 MHz to about 200 MHz. By means of parallel A/D conversion circuitries this range could be multiplied correspondingly. The advantage of CMOS image sensor is that for such range of frequencies the readout noise is substantially independent of the readout frequency. The readout noise also depends on the gain of the Pre-A/D amplifier. The standard deviation for the readout noise can be expressed as:

$$V_{rd} = V_{rd\_base} \cdot (f_{rd}/f_{rd\_base})^\alpha \cdot (A_{gain})^\beta, \quad (EQ. 13)$$

where the $\alpha$ is close to zero for the CMOS technology and about 0.5 for the CCD technology, and $\beta$ value is about 1 for both CMOS and CCD.

Example 2

Simulations

Methods

Performances of an optical detection device according to various exemplary embodiments of the present invention were examined by simulations performed using the parameters and equations presented in Example 1. Parameters having statistical nature (e.g., dark current, readout noise and spatial spread of secondary photoelectrons), were simulated using a random number generator with appropriate distribution.

Figure 10:
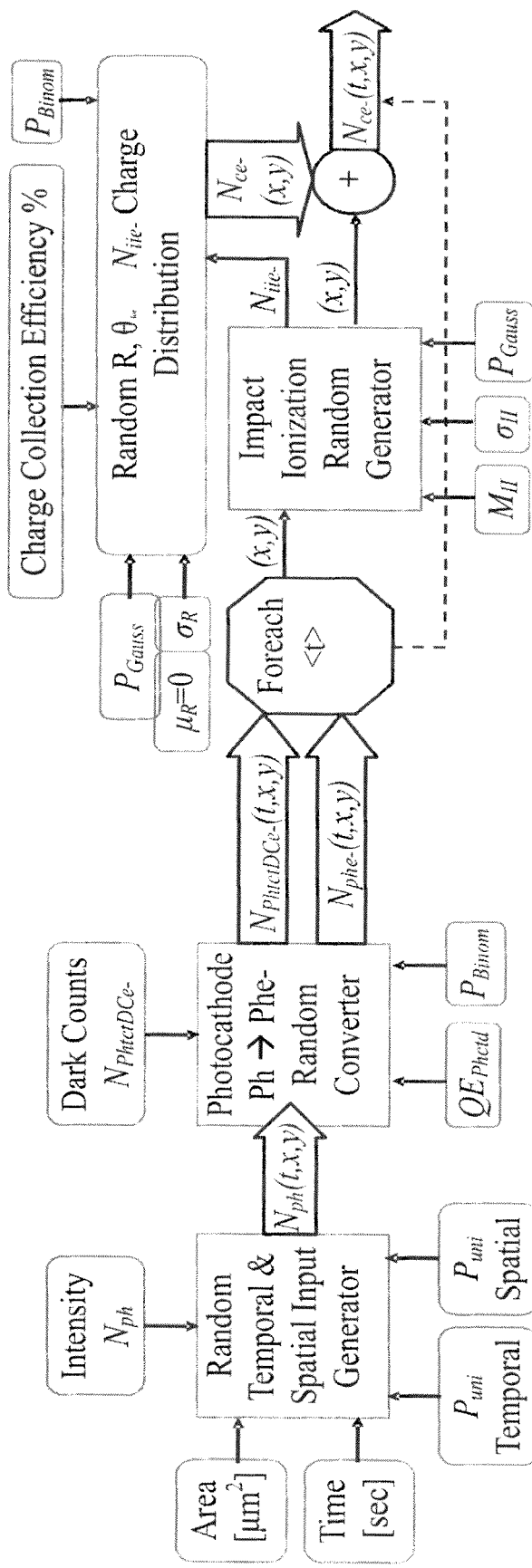
Figure 11:
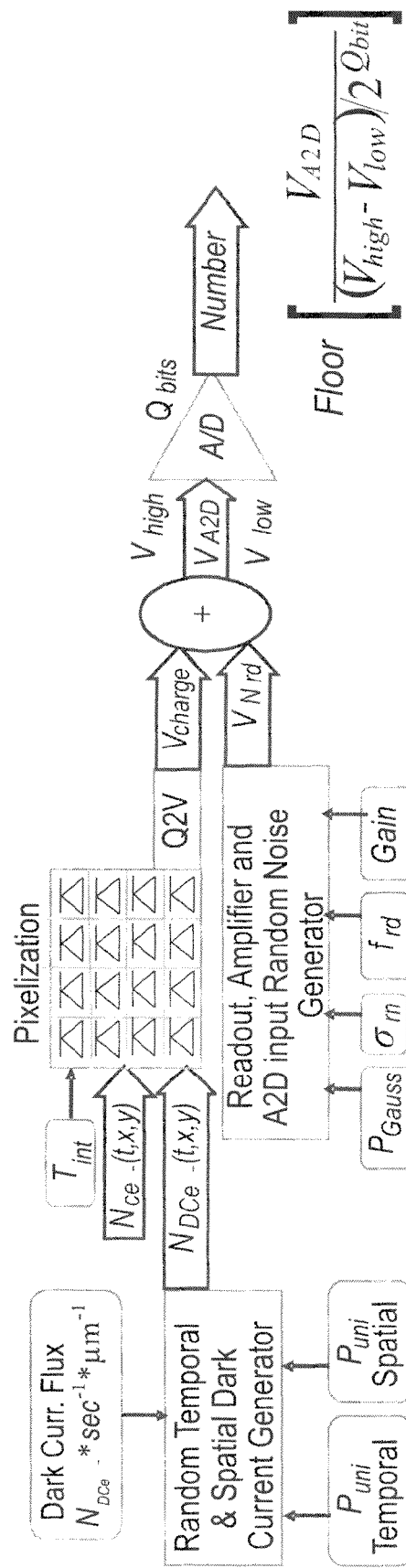

The simulation model is illustrated in FIGS. 10 and 11.

FIG. 10 illustrates the simulation of secondary electrons collection. First, an input of $N_{ph}$ photonic events per given time was generated. A random number generator was used to uniformly distribute the photonic events in a given area and time interval. Each photonic event was represented by a row of a three column vector $N_{ph}(t,x,y)$ where the event time (t) and location (x, y) were indicated. Next, the photonic events were converted to the photoelectron events under random binomial probability distribution of the photocathode Quantum Efficiency $QE_{Phctd}$. The photocathode dark current electrons were randomly generated along with the converted photoelectrons under the intensity of $N_{PhtcthDCe^-}$ per square centimeter per second. The photocathode dark electrons were taken as having a uniform probability distribution.

The dark current and photoelectrons participate in the secondary photoelectrons generation process. Each accelerated photoelectron impacts the back thinned surface of the CMOS image sensor and generates a random number of secondary photoelectrons. This was simulated using normal distribution with a mean gain factor $M_{11}$ (see Equation 6), and standard deviation $\sigma_{11}$ which is the square root of $M_{11}$. The secondary photoelectrons drift under bias on the z-axis toward the charge collection region and also diffuse laterally. The radial diffusion was simulated by random process under normal distribution with mean of $\mu_R = 0$ and standard deviation $\sigma_R = R_{11}$ (see Table 2). In addition, an angular location $\theta$ with uniform random distribution was taken for each secondary photoelectron. The amount of secondary electrons that are collected by the photodiodes of the image sensor is described by the charge collection efficiency (CCE) which indicates the collection success. This was simulated using random numbers with binomial distribution. The collected secondary photoelectrons are represented by a vector $N_{ce^-}(t,x,y)$.

FIG. 11 illustrates the simulation of the CMOS image sensor. The simulation consisted of dark current generation, pixelization, readout noise generation and digitization parts. The dark current generation module had the same structure as the random photonic events generation module described above. It was represented by the flux of the dark current of $N_{DCe-}$ in units of electrons per second per square micrometer. The simulated dark current charge along with the charge of the secondary photoelectrons was accumulated during the exposure period $T_{int}$.

The sensitive area of the image sensor was sub-divided into the pixels (pixelization process) and the charge collected by the corresponding pixel was converted to voltage $V_{charge}$ by multiplying by the charge-to-voltage conversion parameter (C2V) of the image sensor. This voltage, related to the charge collected by the pixel, was combined with the voltage involved by the readout noise process. The readout noise was contributed by the row-column access switching electronics, S&H circuit, pre-A/D amplifier and A/D input cascade. It was simulated using normal probability distribution with mean zero and the standard deviation of Equation 13.

The combined voltage $V_{A2D}$ is the input of the A2D converter. The digitization of the pixel was done by the following expression:

$$D_{out} = \text{Floor}\left(\frac{V_{A2D}}{(V_{high} - V_{low})/2^{Q_{bit}}}\right) \quad \text{(EQ. 14)}$$

The resulted integer number $D_{out}$ was matched to the number of photoelectron events occurred during the same time-window of the corresponding pixel. In the case of difference, either mismatch or false hit was defined, as described in Example 1.

FIG. 12 shows a graphical user interface (GUI) used during the simulations. The GUI allowed controlling the parameters and experimental settings of the image sensor (left panel of the GUI) and presented input data, run status and show select (right panel of the (GUI). The GUI allowed visualizing the input pattern (right panel the GUI), and the pixel array with the simulated events (main panel of the GUI). The GUI also included a playback mode and scroll bar.

Shown in FIG. 12 is a simulation playback, for time-window width of 100 ms (10 time-windows per second) during 10 seconds with intensity of 500 photons per second. The emitting object is displayed on the left panel of the GUI. The main panel of the GUI shows the simulation result for the 86th time-window (designated "sub-sample" in FIG. 12). Photonic events are marked as dark stars; converted photoelectrons are marked by dark circles; secondary, collected impact ionized, photoelectrons are marked by dark dots and dark current electrons by gray dots. The digital result for specific pixel is marked by the corresponding integer number.

The GUI also allows visualizing mismatch and false hit events, photocathode dark counts and voltages contributed by the each components of the resulted signal. The input can be completely random or randomized in accordance to preview bitmap in the left window of the GUI. The resulted picture is displayed by the selection of the digital integration mode at the bottom of the GUI.

Results

FIG. 13 shows the simulation of letter "E" as would be detected during integration time of 10 seconds for the irradiance of 600 photons/s/(2,400 µm²). Shown in FIG. 13 is the resulting image after 44 time-windows corresponding to 4.4 seconds of digital integration. For better visualization a 32 gray levels mode was selected.

The digital integration progress is presented in FIG. 14. As shown, the object is distinguishable after time-window No. 40, corresponding to 4 seconds of digital integration. The object is completely restored after 7 seconds. Further integration introduces additional noise, and thus the preferred integration time for such illumination conditions is about 7 seconds.

FIG. 15 shows simulation results under irradiation of 60 photons/s/(2,400 µm²), with time-window width of 0.1 seconds. The object is distinguishable after time-window No. 400, corresponding to 40 seconds, and completely restored after 70 seconds. Comparing the last time-windows of FIGS. 14 and 15 one sees that the same artifacts appear on both images, irrespectively of the digital integration period, thus demonstrating that the technique of the present embodiments is substantially immune to noise. The reason for the artifacts is the spatial spread of the secondary electrons leading to leakage to adjacent pixels. This kind of noise depends on the signal intensity itself and is local in the sense that it only affects conjugant pixels. For large objects, this of noise is negligible.

FIG. 16 shows simulation results under irradiation of 6 photons/s/(2,400 µm²), with time-window width of 0.1 seconds. The object is distinguishable after time-window No. 2000, corresponding to 200 seconds, and completely restored after 500 seconds. Due to long digital integration a noise contributed by photocathode dark electrons was observed after about 200 seconds.

The present example demonstrates that the technique of the present embodiments is robust, noise immune and provides very high sensitivity.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

REFERENCES

[1] U.S. Pat. No. 6,285,018
[2] U.S. Pat. No. 6,657,178
[3] U.S. Pat. No. 6,747,258
[4] Dulinski, W., et al., Tests of a backside illuminated monolithic CMOS pixel sensor in an HPD set-up. Computer Physics Communications, 2004. 23.
[5] Taketoshi, K. and F. Andoh, Studies of multiplication process of a novel image intensifier of an amplified metal-oxide-semiconductor imager overlaid with electron-bombarded amorphous silicon. Ieee Transactions on Electron Devices, 1999. 46(8): p. 1619-1622.
[6] Andoh, F., et al., Development of a novel image intensifier of an amplified metal-oxide-semiconductor imager overlaid with electron-bombarded amorphous silicon. Ieee Transactions on Electron Devices, 1998. 45(4): p. 778-784.

[7] Aebi, V., et al. EBAPS®: Next Generation, Low Power, Digital Night Vision. in OPTRO 2005 International Symposium. 2005. Paris, France.

What is claimed is:

1. An optical detection device, comprising:
   a photoelectric unit configured to sense incoming photons and to produce electrical signals pertaining to at least a few of said photons within a plurality of temporally resolved time-windows, said photoelectric unit comprising a collection area dividable into a plurality of spatially resolved locations;
   an analog-to-digital unit configured to generate digital representation of said electrical signals separately for each spatially resolved location of said plurality of spatially resolved locations; and
   a digital integrating unit configured to integrate said digital representation over at least part of said temporally resolved time-windows to provide integrated data corresponding to said photons.

2. The device of claim 1, wherein said electric signals comprise secondary electrons component and dark current component, and wherein said photoelectric unit is configured to select temporally resolved time-windows which are sufficiently narrow such that said secondary electrons component is higher than said dark current component.

3. The device of claim 2, wherein said analog-to-digital unit is calibrated to exclude contribution of said dark current component from said digital representation.

4. The device of claim 2, wherein said electric signals comprise readout noise component and wherein said analog-to-digital unit is calibrated to exclude contribution of said readout noise component from said digital representation.

5. The device of claim 4, wherein said analog-to-digital unit is calibrated to exclude contribution of combination of said readout noise component and said dark current component from said digital representation.

6. The device of claim 2, wherein an integration time characterizing said digital integration is selected so as to reduce or eliminate said dark current component.

7. The device of claim 2, wherein said analog-to-digital unit comprises a pre analog-to-digital amplifier characterized by a gain and an offset, and an analog-to-digital converter characterized by a quantization resolution, wherein at least one of said quantization resolution, said gain and said offset is selected such that said secondary electrons contribution is amplified to the least significant bit level of said analog-to-digital converter.

8. The device of claim 1, wherein digital representation corresponding to at least two spatially resolved locations is generated sequentially.

9. The device of claim 1, wherein digital representation corresponding to at least two spatially resolved locations is generated concurrently.

10. The device of claim 1, wherein said electric signals comprise secondary electrons component and dark current component and wherein the area of each spatially resolved location of said plurality of spatially resolved locations is selected sufficiently small such that said secondary electrons component is higher than said dark current component.

11. The device of claim 10, wherein an exposure time of said photoelectric unit is selected such that said secondary electrons component is higher than said dark current component.

12. The device of claim 11, wherein at least one of said area and said exposure time is selected such that the ratio between said secondary electrons component and said dark current component is at least two.

13. The device of claim 1, wherein said photoelectric unit comprises an intensifier for multiplying photoelectrons produced by said photoelectric unit, thereby increasing a secondary electrons component of said electrical signals.

14. The device of claim 13, wherein said electric signals comprise a readout noise component and wherein a gain characterizing said intensifier is selected such that said secondary electrons component is higher than said readout noise component.

15. The device of claim 13, wherein said sensing unit comprises electron bombarded CCD.

16. The device of claim 13, wherein said sensing unit comprises electron bombardment CMOS image sensor.

17. An imaging device, comprising the device of claim 1.

18. The imaging device of claim 17, being a camera.

19. The imaging device of claim 17, wherein said device is configured for capturing images of moving objects.

20. The imaging device of claim 19, wherein said device is configured for providing video images.

21. The imaging device of claim 17, wherein said device is configured for capturing images of static objects.

22. A night vision apparatus, comprising the device of claim 1.

23. An optical sensor comprising the device of claim 1.

24. An object detection system, comprising the optical sensor of claim 23.

25. A motion detection system, comprising the optical sensor of claim 23.

26. A proximity detection system, comprising the optical sensor of claim 23.

27. A temperature measuring system, comprising the optical sensor of claim 23.

28. A parallel light counting system, comprising the optical sensor of claim 23.

29. An optical detection method, comprising:
   using a photoelectric unit for sensing incoming photons, selecting a plurality of temporally resolved time-windows, and providing electrical signals pertaining to at least a few of said photons, within said plurality of temporally resolved time-windows, said electric signals comprising secondary electrons component and dark current component, and said selected time-windows are sufficiently narrow such that said secondary electrons component is higher than said dark current component;
   generating digital representation of said electrical signals; and
   integrating said digital representation over at least part of said temporally resolved time-windows to provide integrated data corresponding to said photons.

30. The method of claim 29, wherein said photoelectric unit comprises a collection area dividable into a plurality of spatially resolved locations, and wherein said digital representation is generated separately for each spatially resolved location of said plurality of spatially resolved locations.

31. A method of manufacturing an optical detection device, comprising:
   assembling a photoelectric unit, an analog-to-digital unit and a digital integrating unit; and
   configuring said photoelectric unit, said analog-to-digital unit and said digital integrating unit such that said photoelectric unit senses incoming photons and produces electrical signals pertaining to at least a few of said photons within a plurality of temporally resolved time-windows, said analog-to-digital unit generates digital representation of said electrical signals, and said digital integrating unit integrates said digital representation over at least part of said temporally resolved time-windows;

wherein said electric signals comprises secondary electrons component and dark current component, and wherein said configuring comprises configuring said photoelectric unit to select temporally resolved time-windows which are sufficiently narrow such that said secondary electrons component is higher than said dark current component.

32. A method of calibrating an optical detection device having a photoelectric unit, an analog-to-digital unit and a digital integrating unit, the method comprising configuring said photoelectric unit, said analog-to-digital unit and said digital integrating unit such that said photoelectric unit senses incoming photons and produces electrical signals pertaining to at least a few of said photons within a plurality of temporally resolved time-windows, said analog-to-digital unit generates digital representation of said electrical signals, and said digital integrating unit integrates said digital representation over at least part of said temporally resolved time-windows;

wherein said electric signals comprises secondary electrons component and dark current component, and wherein said configuring comprises configuring said photoelectric unit to select temporally resolved time-windows which are sufficiently narrow such that said secondary electrons component is higher than said dark current component.

33. An optical detection device, comprising:

a photoelectric unit configured to sense incoming photons and to produce electrical signals pertaining to at least a few of said photons within a plurality of temporally resolved time-windows, said electric signals comprising secondary electrons component, dark current component and readout noise component, said photoelectric unit being configured to select temporally resolved time-windows which are sufficiently narrow such that said secondary electrons component is higher than said dark current component;

an analog-to-digital unit configured to generate digital representation of said electrical signals, and calibrated to exclude contribution of said readout noise component from said digital representation; and a digital integrating unit configured to integrate said digital representation over at least part of said temporally resolved time-windows to provide integrated data corresponding to said photons.

34. An optical detection device, comprising:

a photoelectric unit configured to sense incoming photons and to produce electrical signals pertaining to at least a few of said photons within a plurality of temporally resolved time-windows, said electric signals comprising secondary electrons component and dark current component, and said photoelectric unit being configured to select temporally resolved time-windows which are sufficiently narrow such that said secondary electrons component is higher than said dark current component;

an analog-to-digital unit configured to generate digital representation of said electrical signals; and a digital integrating unit configured to integrate said digital representation over at least part of said temporally resolved time-windows to provide integrated data corresponding to said photons, wherein an integration time characterizing said digital integration is selected so as to reduce or eliminate said dark current component.

35. An optical detection method, comprising:

using a photoelectric unit having a collection area dividable into a plurality of spatially resolved locations for sensing incoming photons and providing electrical signals pertaining to at least a few of said photons, within a plurality of temporally resolved time-windows;

generating digital representation of said electrical signals separately for each spatially resolved location of said plurality of spatially resolved locations; and integrating said digital representation over at least part of said temporally resolved time-windows to provide integrated data corresponding to said photons.

* * * * *